(12) United States Patent
Gong et al.

(10) Patent No.: US 8,163,601 B2
(45) Date of Patent: Apr. 24, 2012

(54) CHIP-EXPOSED SEMICONDUCTOR DEVICE AND ITS PACKAGING METHOD

(75) Inventors: Yuping Gong, Shanghai (CN); Yan Xun Xue, Los Gatos, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 12/894,105

(22) Filed: Sep. 29, 2010

(65) Prior Publication Data

US 2011/0284997 A1 Nov. 24, 2011

Related U.S. Application Data

(63) Continuation-in-part of application No. 12/786,328, filed on May 24, 2010.

(51) Int. Cl.
*H01L 23/498* (2006.01)
*H01L 21/60* (2006.01)

(52) U.S. Cl. ......... 438/111; 257/E21.499; 257/E21.506; 257/E21.507; 438/110; 438/112; 438/113; 438/118; 438/123

(58) Field of Classification Search ........... 257/E21.499, 257/E21.507, E21.506; 438/110, 111, 112, 438/113, 118, 123
See application file for complete search history.

(56) References Cited

U.S. PATENT DOCUMENTS

| | | | |
|---|---|---|---|
| 7,122,884 B2 * | 10/2006 | Cabahug et al. | 257/676 |
| 2006/0197200 A1 * | 9/2006 | Kajiwara et al. | 257/673 |
| 2007/0210430 A1 * | 9/2007 | Kagii et al. | 257/678 |
| 2007/0235774 A1 * | 10/2007 | Zandman et al. | 257/256 |

* cited by examiner

*Primary Examiner* — Eugene Lee
*Assistant Examiner* — Peniel M Gumedzoe
(74) *Attorney, Agent, or Firm* — Chein-Hwa Tsao; CH Emily LLC

(57) ABSTRACT

A method of making a chip-exposed semiconductor package comprising the steps of: plating a plurality of electrode on a front face of each chip on a wafer; grinding a backside of the wafer and depositing a back metal then separating each chips; mounting the chips with the plating electrodes adhering onto a front face of a plurality of paddle of a leadframe; adhering a tape on the back metal and encapsulating with a molding compound; removing the tape and sawing through the leadframe and the molding compound to form a plurality of packaged semiconductor devices.

11 Claims, 11 Drawing Sheets

CHIP-EXPOSED SEMICONDUCTOR DEVICE AND ITS PACKAGING METHOD

CROSS REFERENCE TO OTHER APPLICATIONS

This application is a continuation in part of U.S. patent application Ser. No. 12/786,328 entitled "A Wafer Level Chip Scale Package Method Using Clip Array" filed May 24, 2010, which is incorporated herein by reference for all purpose.

BACKGROUND OF THE INVENTION

1. Technical Field

The present invention relates to a semiconductor device package, and more specifically, to a chip-exposed semiconductor device without extending leads and its production method.

2. Description of the Related Art

Surface mounted technology (SMT) is commonly used to mount electronic component on the printed circuit board (PCB). Power handling capacity, heat dissipation and device size are the important parameters in selecting semiconductor power device for SMT applications. It is desirable to produce a semiconductor power device capable of delivering high power with excellent heat dissipation, smaller footprint with low profile. Unfortunately certain parameters have to be sacrificed in order to meet the specification of others due to the nature they are competing with each other. In general small footprint usually means small chip size and small heat dissipation surface area, which tends to limit the power handling capability.

U.S. Pat. No. 7,154,168 discloses a flip chip semiconductor device and its making method, wherein the semiconductor device includes a molding compound having a window, a semiconductor chip and a leadframe. The molding compound covering at least a portion of the leadframe and at least a portion of the semiconductor die, with a plurality of leads extending out of the molding compound and laterally away from the molding compound, and a backside of the semiconductor chip exposed through the window forming an exterior surface of semiconductor die package. Meanwhile, U.S. Pat. No. 7,256,479 discloses a method of making a semiconductor package comprising a semiconductor die, a leadframe structure and a molding material formed around at least a portion of the die and at least a portion of the leadframe structure, wherein a first surface of the semiconductor die is substantially flush with at least part of an exterior surface of the molding material and a solderable layer in contact with the molding material on at least a portion of the exterior surface of the molding material with a plurality of leads arranged on both sides of the package of the semiconductor device. These technical approaches provide low profile semiconductor device with good thermal dissipation but fail to deliver a higher power beyond limitation of a traditional package.

SUMMARY OF THE INVENTION

The invention provides a method of making a chip-exposed semiconductor package comprising:

plating a metal on a front side of a wafer comprising a plurality of chips thereon therefore forming a plurality of plating areas on a front face of each chip;

grinding a backside of the wafer to reduce a thickness of the wafer;

depositing a back metal layer on the backside of the wafer after grinding;

applying a layer of conductive adhesive material on said plurality of plating areas;

sawing the wafer with the back metal layer to form a plurality of separate chips each having the back metal layer located on a backside of the chip;

providing a leadframe comprising a plurality of paddles and mounting a chip with the front face of the chip adhering onto a front face of each of the plurality of paddle through the conductive adhesive material disposed on the front face of the chip;

adhering a tape on the back metal located on the backside of the chip;

encapsulating the leadframe and the plurality of chips adhered onto the leadframe with a molding compound;

removing the tape to expose the back metal on the backside of the chip through the molding material;

sawing through the leadframe and the molding compound to form a plurality of packaged semiconductor devices.

In one embodiment each chip on the wafer is provided with a gate electrode comprising a first gate metal layer and a source electrode comprising a first source metal layer on the front face of the wafer wherein the step of forming a plurality of plating areas on a front face of each chip comprising plating a second gate metal layer on top of the first gate metal layer and a second source metal layer on top of the first source metal layer. In another embodiment each chip is further provided with a drain electrode comprising the back metal layer.

In another embodiment each of the paddles is provided with a first metal contact finger and a plurality of second metal contact fingers substantially coplanar with the first metal contact finger forming the paddle, wherein the step of mounting the chip to the paddle further comprising flip-chip mounting the chip onto the paddle with the second gate metal layer connected to the first metal contact finger and the second source metal layer connected to the plurality of the second metal contact fingers.

In another embodiment a method of making a chip-exposed semiconductor package comprising:

providing a leadframe array comprising a plurality of leadframe units wherein each of the leadframe unit comprising a paddle portion and a terminal portion, the paddle portion comprising a first metal contact finger and a plurality of second metal contact fingers substantially coplanar with the first contact finger therefore providing a paddle surface for a chip mounting thereon, the terminal portion comprising a gate terminal connecting to the first contact finger and a source terminal connecting to the plurality of the second contact fingers, wherein both the gate terminal and the source terminal extending vertically from the paddle surface to and terminating at a terminal surface substantially parallel to the paddle surface thus providing a bottom face of the gate terminal and a bottom face of the source terminal substantially coplanar to the terminal surface;

flip-chip mounting a semiconductor chip on the paddle portion of each of the plurality of the leadframe unit, wherein each chip having a gate electrode and a source electrode disposed on a front face and a drain electrode disposed on a back face opposite to the front face, the gate electrode electrically connecting to the first contact finger and the source electrode electrically connecting to the plurality of the second contact fingers, wherein the drain electrode comprising a back metal layer substantially coplanar to the terminal surface;

adhering a tape onto the back metal of the chip and the bottoms of the gate terminal and source terminal;

encapsulating the plurality of leadframe units and the plurality of chips adhered onto the leadframe with a molding compound;

removing the tape to expose the back metal on the backside of the chip and the bottoms of the gate and source terminals through the molding material;

sawing through the leadframe and the molding compound to form a plurality of packaged semiconductor devices, a side face of the gate terminal and a side face of the source terminal exposed on a sidewall of the packaged semiconductor device.

The invention further disclosed a chip-exposed semiconductor device comprising:

a semiconductor chip having a gate electrode and a source electrode disposed on a front face and a drain electrode disposed on a back face opposite to the front face, the gate electrode comprising a first gate metal layer and the source electrode comprising a first source metal layer; a second gate metal layer plated atop of the first gate metal layer and a second source metal layer plated atop of the first source metal layer;

a first metal contact finger electrically connected the second gate metal layer, the first metal contact finger connecting to a gate terminal extending from a plane substantially coplanar to the front face of the chip to a plane substantially coplanar to the back face of the chip via an extending structure of the gate terminal; a plurality of second metal contact fingers electrically connected to the second source metal layer, the second metal contact fingers connecting to a source terminal extending from a plane substantially coplanar to the front face of the chip to a plane substantially coplanar to the back face of the chip via an extending structure of the source terminal;

a molding material encapsulating the chip, the first contact metal finger and the second contact metal finger wherein the back face of the chip being exposed through the molding material.

In one embodiment a back metal layer deposited on the back face of the chip provides the drain electrode of the chip exposed through the molding material for external connection, a bottom of the gate terminal and a bottom of the source terminal are exposed through the molding material for external connection. In another embodiment a side face of the gate terminal and a side face of the source terminal are exposed through the molding material on a side wall of the package. In yet another embodiment the side face of the gate terminal and the side face of the source terminal are coplanar to the side wall of the package and perpendicular to the back metal layer.

The semiconductor device as provided in the invention has no external leads extending beyond the package body, therefore the additional space for accommodating the external leads in prior art package can be translated inside the package body to accommodate a larger size semiconductor chip for delivering more power while maintain the same footprint.

DETAILED DESCRIPTION OF THE INVENTION

Figure 1:
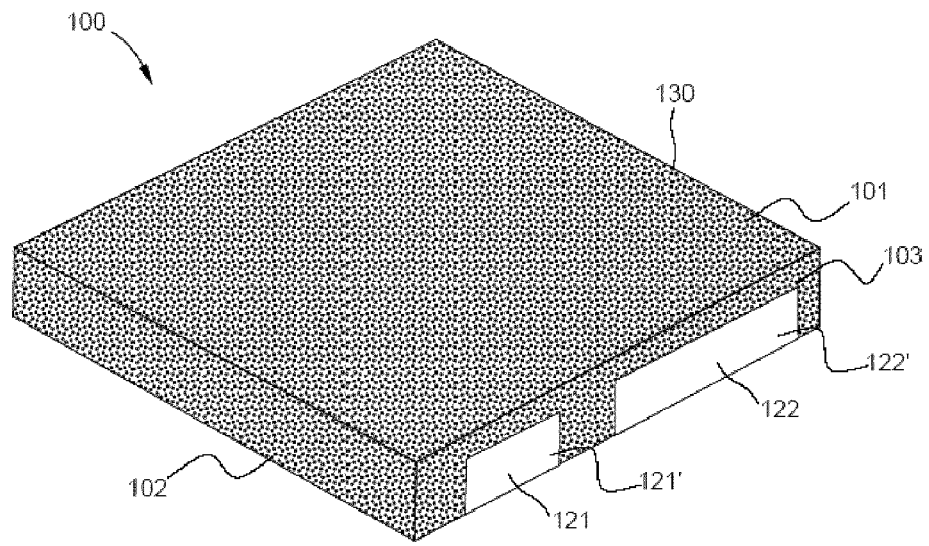
FIG. 1 is a top view of the semiconductor device package according to this invention.

FIG. 1 is a top view of a semiconductor device according to this invention. The semiconductor device 100 is a none-lead package with a package body 130 including a top surface 101, a bottom surface 102 and a sidewall 103 perpendicular to the bottom surface 102. A side faces 121' of a gate terminal 121 and a side face 122' of a source terminal 122 of the semiconductor device 100 exposed on the sidewall 103.

Figure 2:
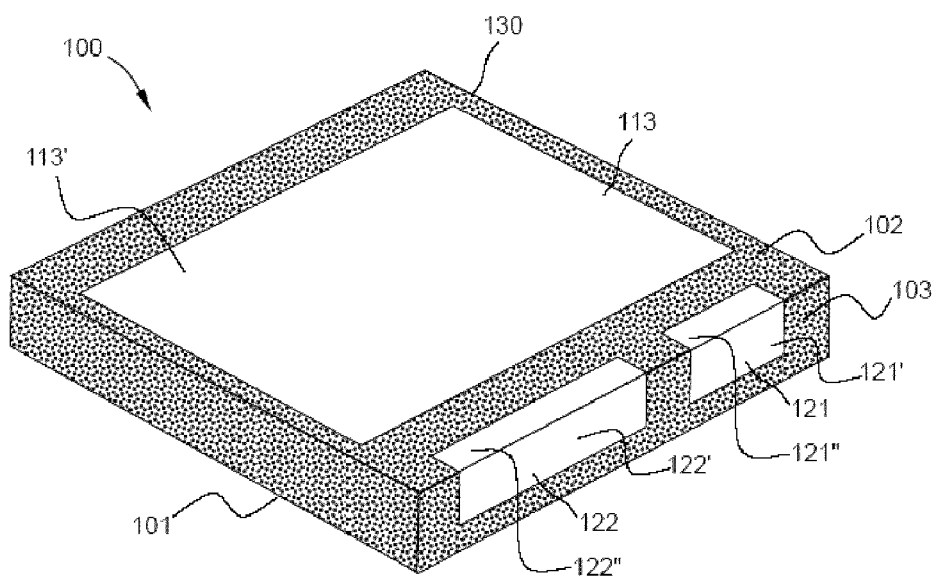
FIG. 2 is a bottom view of the semiconductor device package according to this invention.

As shown in FIG. 2 a bottom view of a semiconductor device 100, a backside metal layer 113, a bottom 121" of the gate terminal 121 and a bottom 122" of the source terminal 122 are exposed on the bottom surface 102 of the package body 130.

Figure 3:
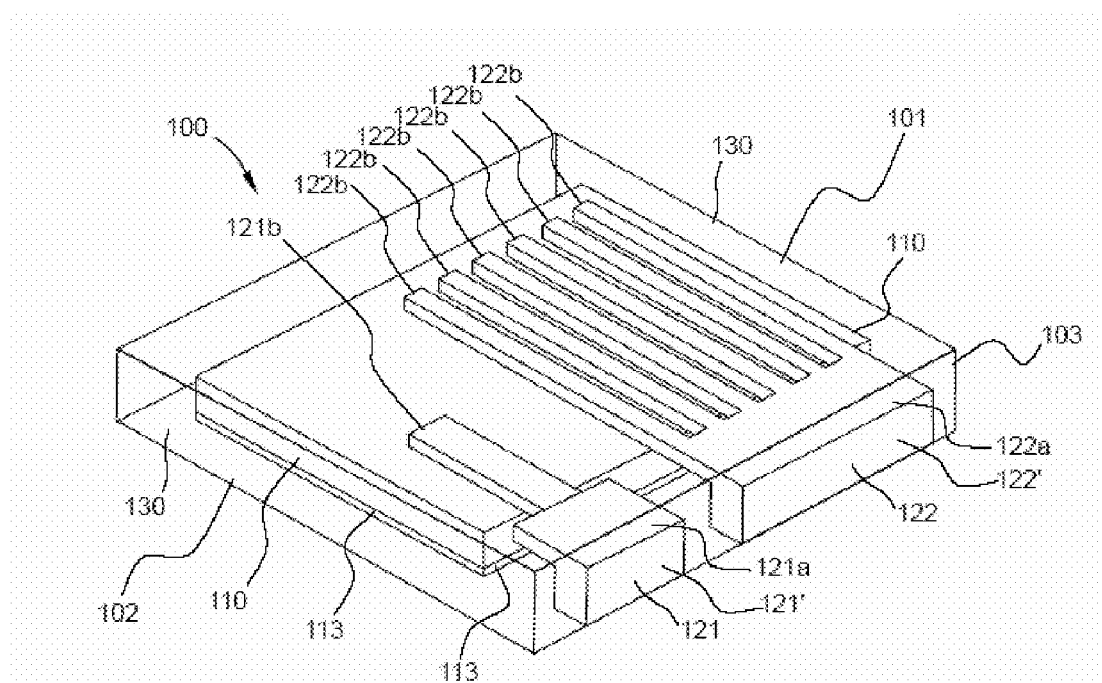
FIG. 3 is a perspective view of the structure of the semiconductor device package according to this invention.
Figure 4:
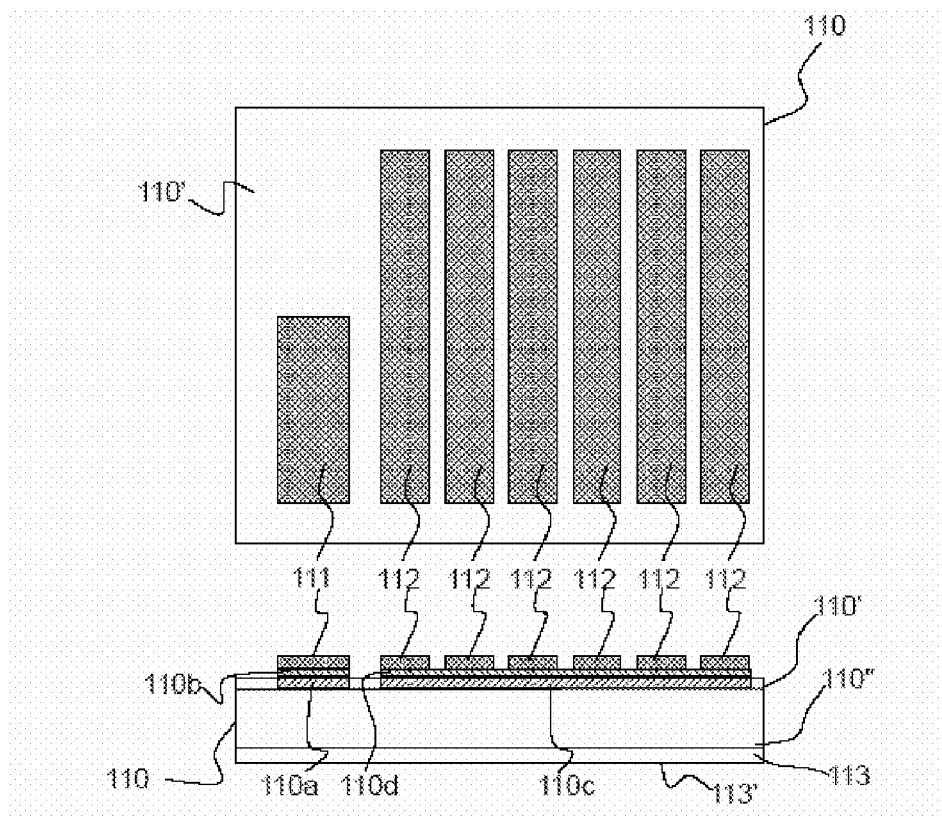
FIG. 4 is a top view and a cross sectional view of a semiconductor device chip encapsulated in the package according to this invention.

As shown in a perspective structure view FIG. 3 of the semiconductor device 100, a semiconductor chip 110 is molded and encapsulated in the package 130, wherein the package body 130 is generally made of solidified epoxy molding compound. By way of example but not limitation, the semiconductor chip 110 may be a vertical MOSFET chip with a gate region and a source region located on a top portion of the chip 110 and a drain region located on a bottom portion of the chip 110. FIG. 4 shows a top view and a cross sectional view of the chip 110. As shown in FIG. 4, a first gate metal layer 110a and a first source metal layer 110c are disposed on a front face 110' of the chip 110 while a backside metal layer 113 is disposed on a backside 110" of the chip 110. The first gate metal layer 110a electrically connects to the gate region (not shown) of the chip 110 thus providing a gate electrode of the chip 110. The first source metal layer 110c electrically connects to the source area (not shown) of the chip 110 thus providing a source electrode of the chip 110. The backside metal layer 113 electrically connects to the drain region (not shown) of the chip 110 thus providing a drain electrode of the chip 110. The gate and source electrodes are generally formed of aluminum or aluminum alloy, and preferably formed of Al—Si—Cu alloy through metal deposition. A preferred material for the backside metal layer 113 is Ti—Ni—Ag alloy (Ti/Ni/Ag). The backside metal layer 113 is generally formed by metal deposition or evaporation on Silicon substrate at the backside 110" of the chip 110. A bottom face 113' of metal layer 113 exposed on the bottom surface 102 of the package body 130 as shown in FIG. 2. A second gate metal layer 110b is plated on top surface of the first gate metal layer 110a and a second source metal layer 110d is plated on top surface of the first source metal layer 110c. A preferred material for the second gate metal layer 110b and the second source metal layer 110d is Ti—Ni—Ag alloy (Ti/Ni/Ag).

As shown in FIG. 4, the second gate metal layer 110b of the chip 110 is applied with a conductive adhesive material 111 while multiple locations on the second source metal layer 110d are applied with a conductive adhesive material 112. The preferred material of the conductive adhesive material 111 and 112 are conductive silver paste (Epoxy) and solder paste. In combination with the structure of the chip 110, as shown in FIG. 4, the structure of the semiconductor device 100, as that shown in FIG. 3, further includes a gate terminal 121 and an extending structure 121a of the gate terminal connecting with the gate terminal 121, wherein the extending structure 121a of the gate terminal is provided with a first metal contact finger 121b which extends over and contacts to the second gate metal layer 110b (not shown in the figure) of the chip 110, and the second gate metal layer 110b is connected with the first metal contact finger 121b via the conductive material 111 applied on the second gate metal layer 110b; the semiconductor device 100, as shown in FIG. 3, also includes a source terminal 122 and an extending structure 122a of the source terminal connecting with the source terminal 122, wherein the extending structure 122a of the source terminal is provided with a plurality of the second metal contact fingers 122b which extend over and contact to the second source metal layer 110d (not shown in the figure) of the chip 110, and the second source metal layer 110d is connected with the second metal contact finger 122b via the conductive material 112 applied on several locations of the second source metal layer 110d. That is: the first metal contact finger 121b, as shown in FIG. 3, connects with the second gate metal layer 110b via the conductive material 111, as shown in FIG. 4; a plurality of the second metal contact fingers 122b, as shown in FIG. 3, connect with the second source metal layer 110d via applying the conductive material 112 on several locations, as shown in FIG. 4.

Figure 5:
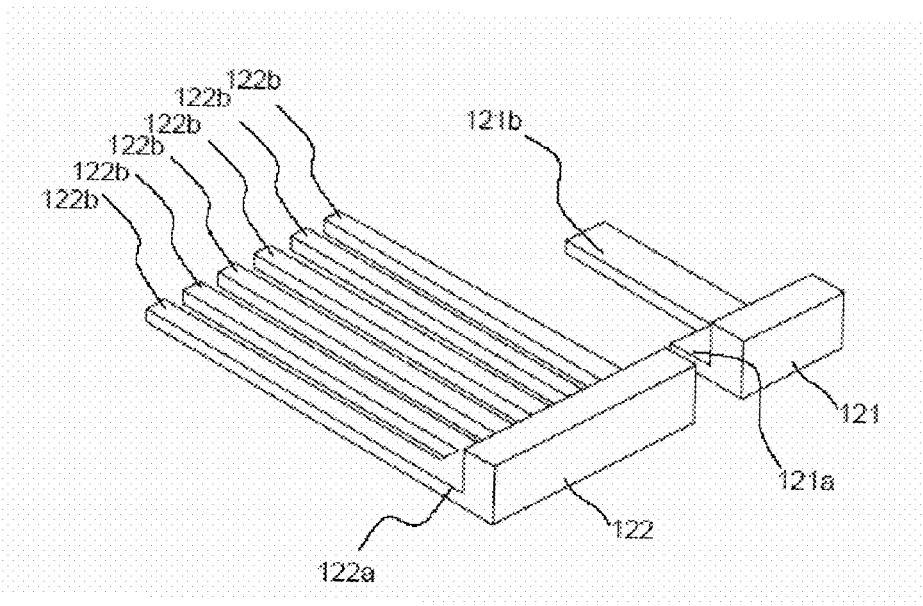
FIG. 5 is the schematic view of the structure of a leadframe according to this invention.
Figure 6:
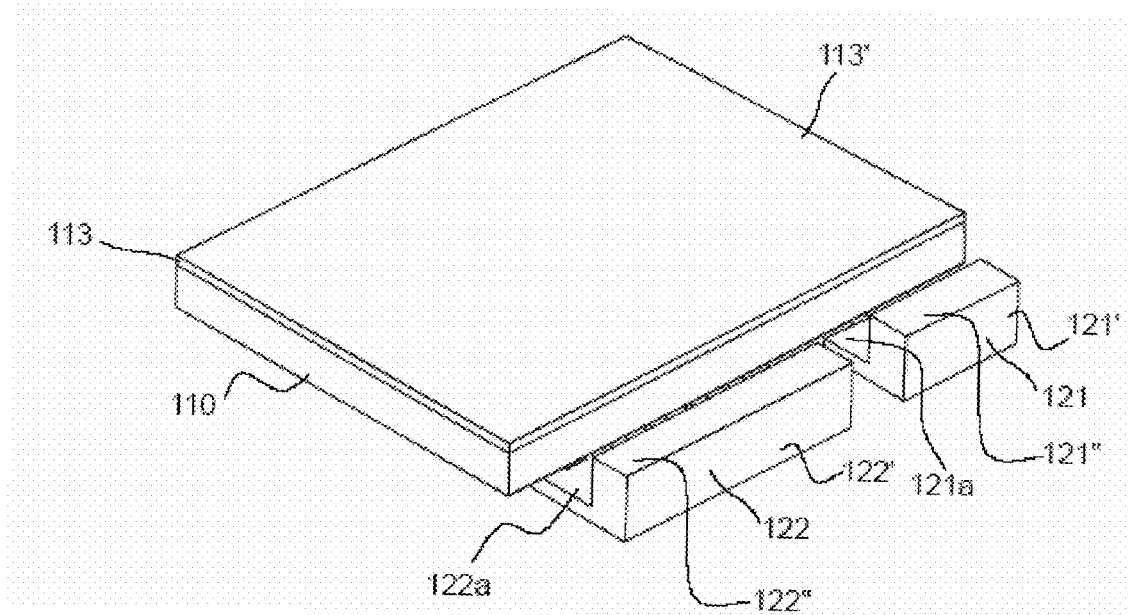
FIG. 6 is the schematic view of the structure of the chip flip-chip mounted on the lead.

As shown in FIGS. 5 and 6, in the semiconductor device 100, the first metal contact finger 121b connected to the gate terminal 121 via the extending structure 121a of the gate terminal and the plurality of second metal contact fingers 122b connected to the source terminal 122 via the extending structure 122a of the source terminal constitute a leadframe of the package. The leadframe includes a paddle portion providing a paddle surface for the chip 110 mounting thereon and a terminal portion extending vertically from the paddle surface to a terminal surface parallel to the paddle surface. The paddle portion comprises the first metal contact finger 121b and the plurality of second metal contact fingers 122b substantially coplanar with the first contact finger. The gate terminal 121 forms a first part of the terminal portion while the source terminal 122 forms a second part of the terminal portion with both the gate terminal and the source terminal terminated at the terminal surface.

As shown in FIG. 6, a thickness of chip 110 is so choose that when the chip 110 is flip-chip mounted on the paddle portion of leadframe, the bottom surface 113' of the backside metal layer 113, a bottom 121" of the gate terminal 121 and a bottom 122" of the source terminal 122 are substantially coplanar.

As shown in FIG. 3, 4, the package body 130 is used to mold and cover the chip 110 with the first gate metal layer 110a, the first source metal layer 110c, the second gate metal layer 110b, the second source metal layer 110d and the backside metal layer 113. The package 130 is also used to mold and at least partially cover the gate terminal 121 and its extending structure 121a, the first metal contact finger 121b, the source terminal 122 and its extending structure 122a, the second metal contact finger 122b. As shown in FIG. 2, in one embodiment, the bottom 121" of the gate terminal 121 exposed on the bottom 102 of the package 130 is used to form the outer gate contact terminal of the chip 110; the bottom 122" of the source terminal 122 exposed on the bottom 102 of the package 130 is used to form the outer source contact terminal of the chip 110; the bottom 113' of the backside metal layer 113 exposed on the bottom of the package 130 is used to form the outer drain contact terminal of the chip 110. In another embodiment, the side face 121' of gate terminal 121 and the side face 122' of source terminal 122 are exposed on a sidewall of the package 130. In general, the outer gate contact terminal, the outer source contact terminal and the outer drain contact terminal as the transmission terminal of the electrical signal are used to connect the semiconductor device 100 to the outer component and respectively presented as the gate, source and drain of the semiconductor device 100.

The semiconductor device 100 may be mounted to a printed circuit board (PCB) using surface mount technology (SMT) with the backside metal layer 113 exposed to be welded to thermal dissipation pad of the PCB via welding material like solder paste, thus provides superior electrical and thermal properties. The semiconductor device 100 is different from the traditional semiconductor package (e.g. TSOP package) in that it uses large contact area metal plates instead of bonding wires inside the package. Because of the short conductive path between the chip and the electrode terminals, parasitic inductance and package resistance attributed to the wiring are greatly reduced. The bottom exposed backside metal layer 113, the side-exposed gate terminal 121 and the side-exposed source terminal 122 improves heat-dissipation path. The semiconductor device 100 has no external leads extending beyond the package body, therefore the additional space for accommodating the external leads in prior art package can be translated inside the package body to accommodate a larger size semiconductor chip for delivering more power while maintain the same footprint.

Figure 7:
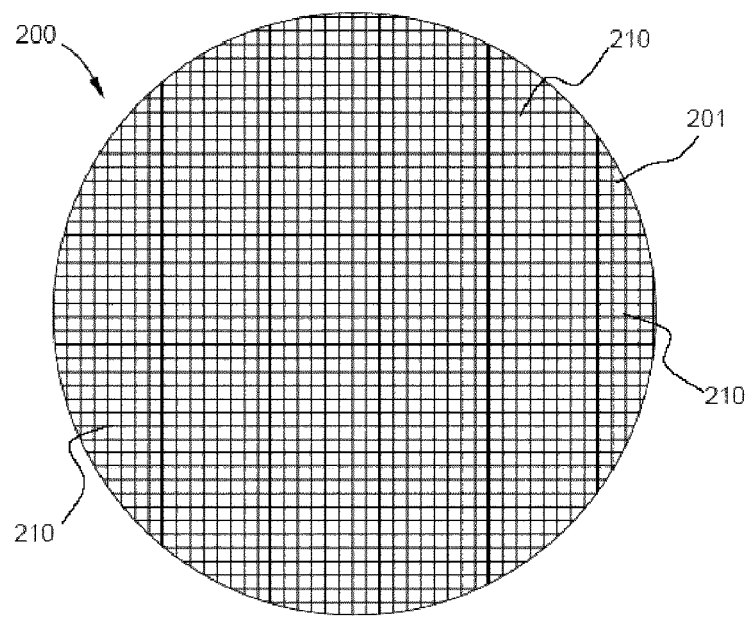
FIGS. 7-31 illustrate the process of manufacturing the semiconductor device package according to this invention.
Figure 8:
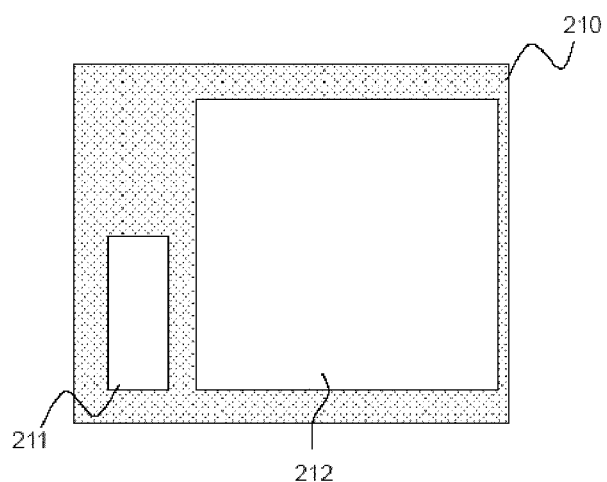

FIGS. 7-31 illustrate the process of manufacturing the semiconductor device package according to this invention. As shown in a top view in FIG. 7, a wafer 200 including a plurality of semiconductor device chips 210 is provided. Each chip 210 is provided with a first gate metal layer electrically connecting to a gate region of the chip (not shown) forming a gate electrode of the device chip and a first source metal layer electrically connecting to a source region of the chip (not shown) forming a source electrode of the device chip on the front face of the chip 210. A metal plating process is carried out to plate a metal layer on the front face 201 of wafer 200, forming a second gate metal layer 211 plated on top of the first gate metal layer and a second source metal layer 212 plated on top of the first source metal layer as shown in a top view of FIG. 8.

Figure 9:
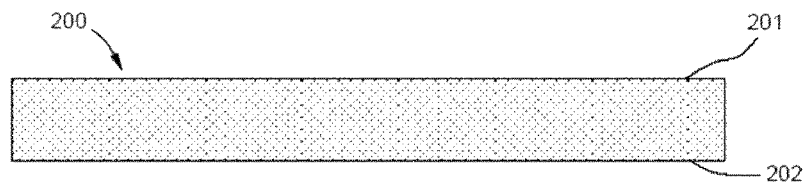
Figure 10:
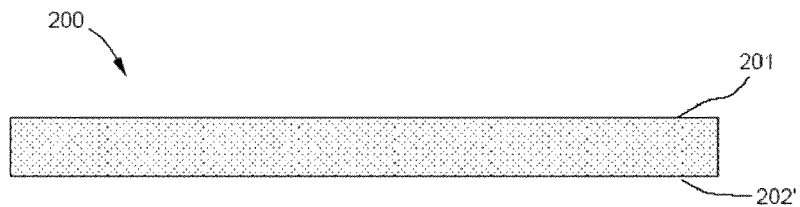

As shown in FIG. 9, in the cross sectional view of the wafer 200, a wafer backside grinding process is carried out on the backside 202 of wafer 200 to reduce the thickness of the silicon substrate to a predetermined thickness as shown in FIG. 10.

Figure 11:
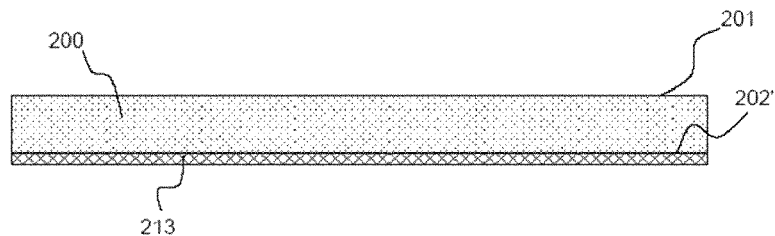

As shown in FIG. 11, a backside metal layer 213 of Ti—Ni alloy or Ag—Ni alloy with good electric conductivity and chemical resistivity is deposited on the backside silicon 202' of the thinned wafer 200 in the cross sectional view.

Figure 12:
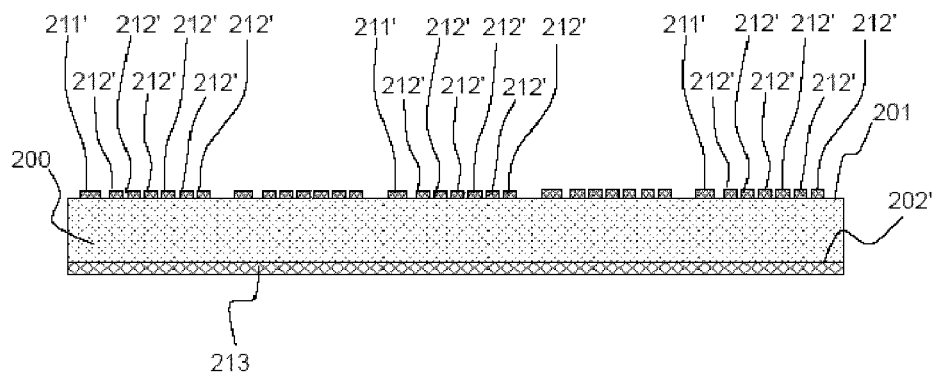

As shown in cross sectional view FIG. 12, a layer of conductive adhesive material such as conductive silver paste (Epoxy) or solder paste with sticking property is applied onto the surface of the plated areas on each of the chip 210 of the wafer 200 to form a conductive adhesive material 211' on the second gate metal layer 211, and a plurality of the conductive adhesive material 212' on the second source metal layer 212 of each chip 210. The conductive material 211' and 212' may be pre-cured to a B state for the convenience of the following steps.

Figure 13:
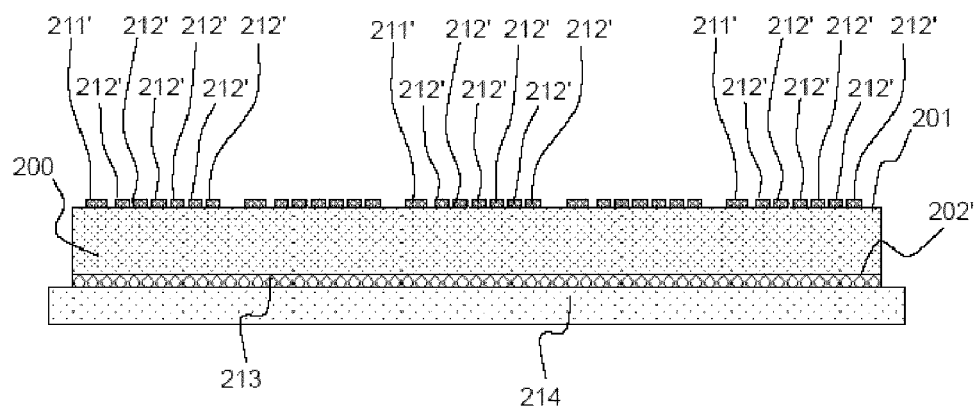
Figure 14:
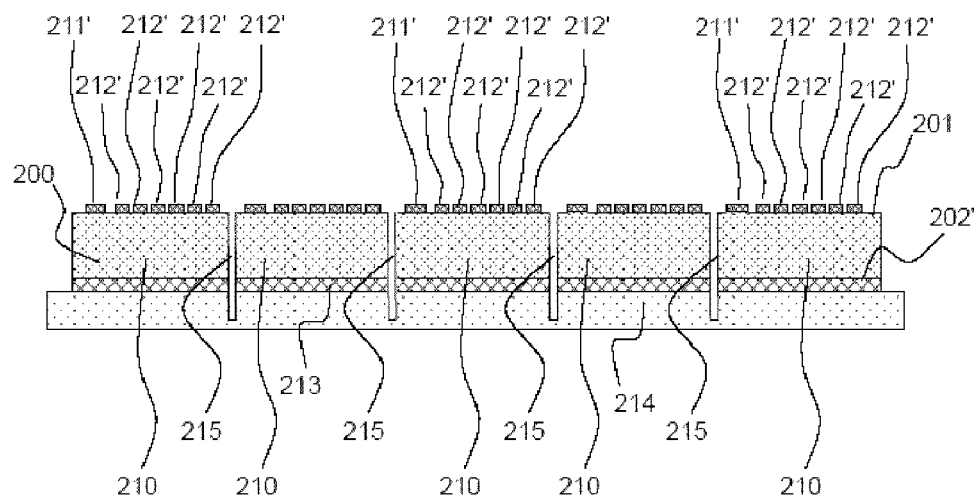
Figure 15:
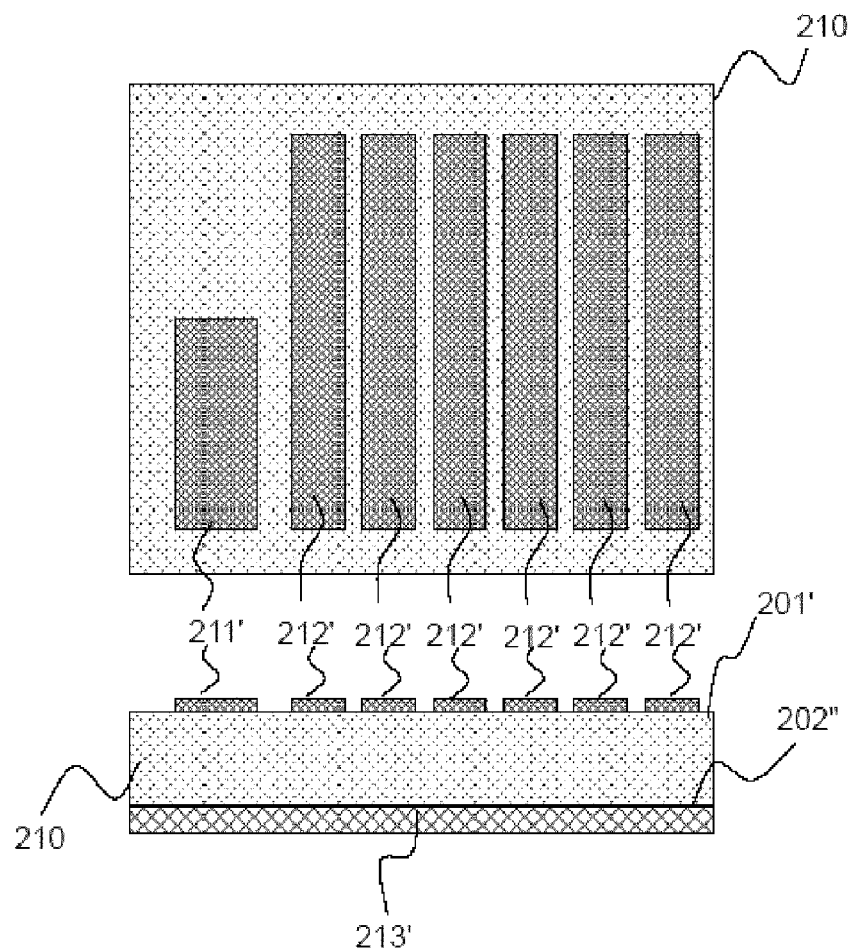

As shown in cross sectional view FIG. 13, a sawing film 214 such as a blue tape generally used in the industry is stuck on the surface of the backside metal layer 213. As shown in cross sectional view FIG. 14, the wafer 200 is saw through into the film 214 from the wafer front face 201, wherein the cut through notches 215 in the figure are located at the specified scribed lines. The metal layer 213 is sawed through at the same time while the sawing film 214 is partly sawed in the vertical direction to divide the wafer 200 into a plurality of chips 210 with a back metal layer 213'. Therefore, a plurality of chips 210 separate from the wafer 200 with the backside metal layer 213' forming the drain electrode of the chip 210. As shown in a top view and a cross sectional view in FIG. 15, the front face 201' of each chip 210 with the backside metal layer 213' is a part of the front face 201 of the wafer 200 in FIG. 14 while the backside 202" of each chip 210 is part of the backside 202' of the wafer 200 in FIG. 14. Further, the conductive adhesive material 211' applied on the second gate metal layer 211 (not shown in FIG. 15, please refer to FIG. 8) of the chip 210 and the conductive adhesive material 212' applied at a plurality of locations on the second source metal layer 212 (not shown in FIG. 15, please refer to FIG. 8) of the chip 210 remain intact located on the front face 201' of the chip 210.

Figure 16:
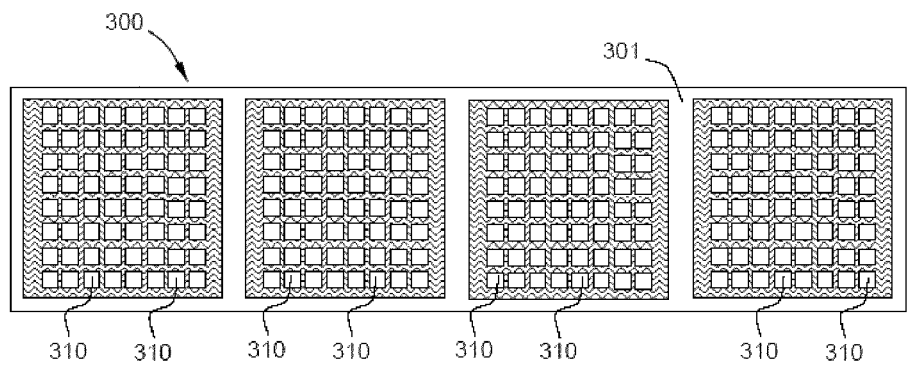
Figure 17:
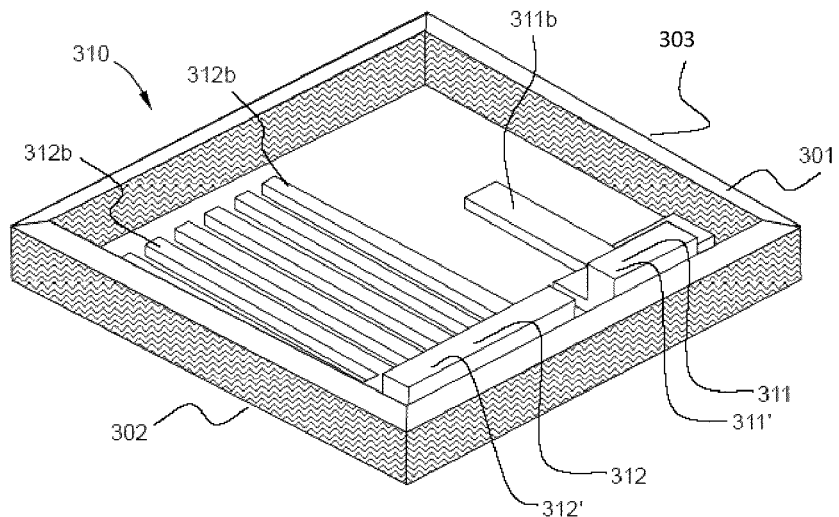
Figure 18:
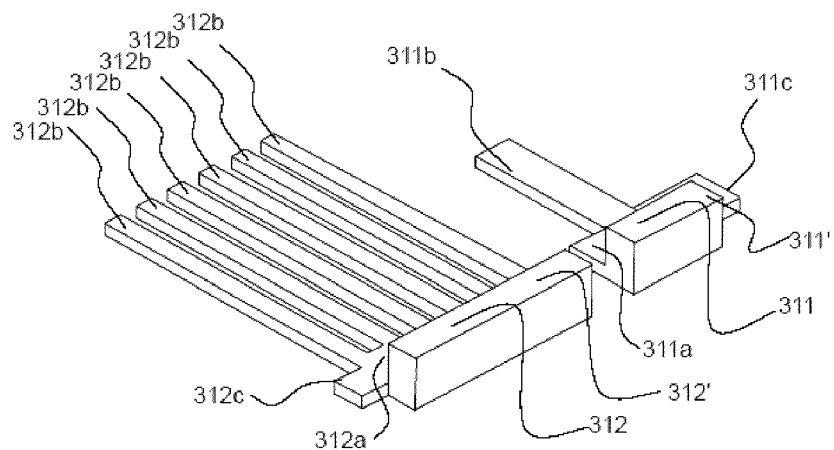

Next, a leadframe having a first face and a second face opposite to the first face is provided. As shown in FIG. 16, a top view from the leadframe first face 301, the leadframe may be provided as a leadframe array 300 includes a plurality of leadframe units 310. The schematic view FIG. 17 shows that the leadframe units 310 connected with each other through a frame 303 to form the leadframe array 300 with the first surface 301 and an opposite second surface 302. The specific structure of the leadframe unit 310 is shown in perspective view of FIG. 18, wherein each of the leadframe unit 310 includes a paddle portion providing a paddle surface below and parallel to the leadframe first surface 301 for a chip mounting thereon and a terminal portion extending vertically from the paddle surface to a terminal surface coplanar to the leadframe first surface 301. The paddle portion comprising a first metal contact finger 311b and a plurality of second metal contact fingers 312b substantially coplanar with the first contact finger. In the leadframe unit 310, the first metal contact finger 311b is connected to a gate terminal 311 forming a first part of the terminal portion via an extending structure 311a of the gate terminal while the plurality of the second metal contact fingers 312b are connected to a source terminal 312 forming a second part of the terminal portion via an extending structure 312a of the source terminal, with both the gate terminal and the source terminal terminated at the terminal surface thus providing a gate terminal bottom face 311' and a source terminal bottom face 312' coplanar to the first surface of the leadframe. The extending structure 311a of the gate terminal is vertical to the gate terminal 311 while the extending structure 312a of the source terminal is vertical to the source terminal 312. Referring to both FIG. 17 and FIG. 18, the extending structure 312a of the source terminal is connected with a tie bar 312c, therefore the plurality of the second metal contact fingers 312b and the source terminal 312 are connected to the frame 303 via the tie bar 312c; the extending structure 311a of the gate terminal is connected with a tie bar 311c, therefore the first metal contact finger 311b and the gate terminal 311 are connected to the frame 303 via the tie bar 311c. Alternatively the gate terminal 311 and the source terminal 312 may be connected to the frame 303 through additional tie bars or entirely fused with the frame 303.

Figure 19:
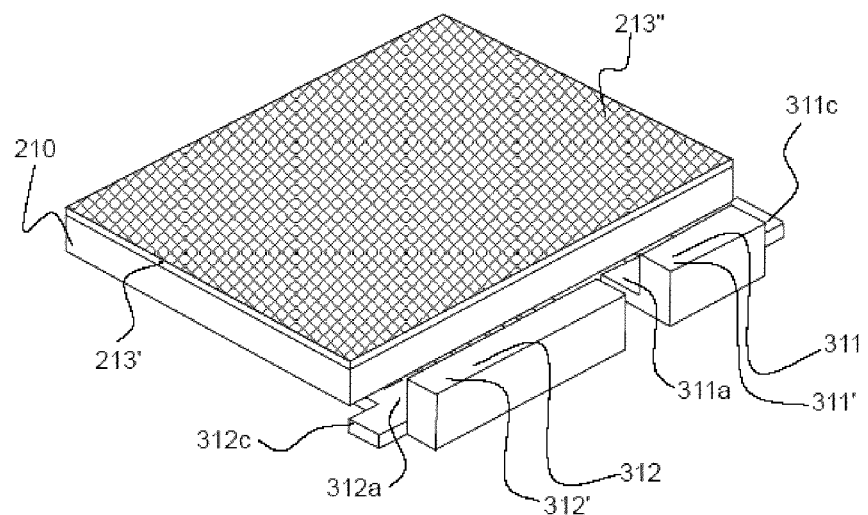

As shown in perspective view of FIG. 19, a chip 210 is flip-chip mounted onto the paddle surface of the leadframe through a die attaching process by aligning the conductive adhesive material 211' and 212' on the front face 201' of the chip 210 to the corresponding first metal contact finger 311b and the second metal contact fingers 312b of the paddle such that the second gate metal layer 211 is electrically connected with the first metal contact finger 311b via the conductive adhesive material 211' while the second source metal layer 212 is electrically connected with a plurality of the second metal contact fingers 312b via the conductive adhesive material 212', thus forming the structure of the chip sticking in the paddle shown in FIG. 19, wherein the predetermined thickness of the wafer is choose such that the bottom 213" of the backside metal layer 213', the bottom surface 311' of the gate terminal 311 and the bottom surface 312' of the source terminal 312, as well as the leadframe first surface 301 are substantially coplanar.

Figure 20:
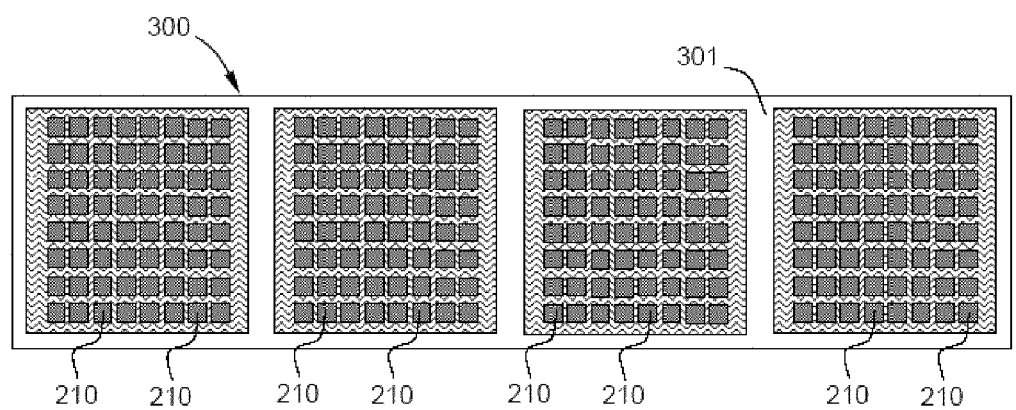
Figure 21:
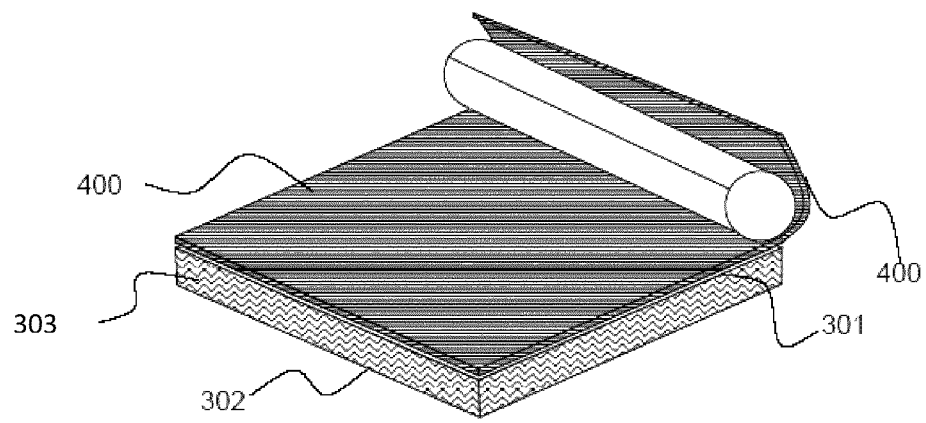
Figure 22:
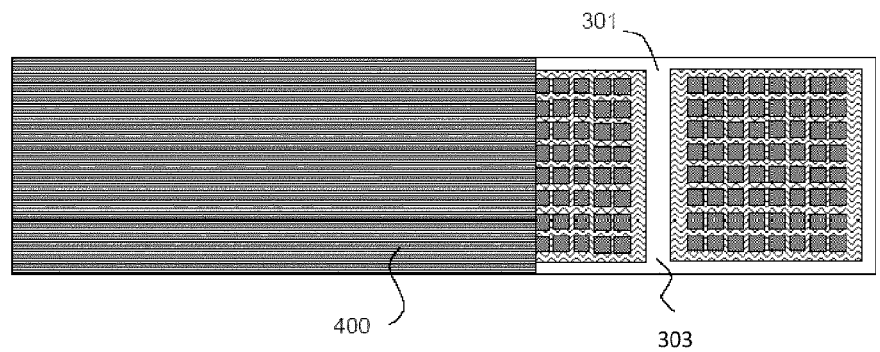
Figure 23:
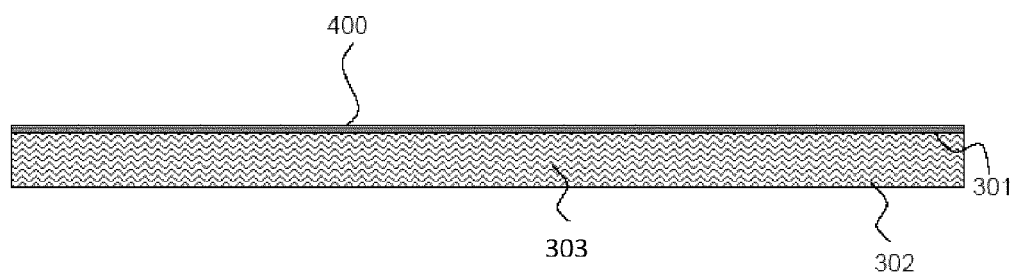

As shown in top view of FIG. 20, each paddle on the leadframe 300 is mounted with a chip 210 thereon. as shown in perspective view FIG. 21 and top view FIG. 22, a layer of tape 400 is applied adhering to the bottom 213" of the backside metal layer 213', the bottom surface 311' of the gate terminal 311 and the bottom surface 312' of the source terminal 312 of each unit, as well as the first surface 301 of the leadframe array 300, thus leading to the sectional structure of the first surface 301 of the leadframe array 300 covered with the layer of tape 400, as shown in cross sectional view FIG. 23, wherein the opposite surface 302 of the leadframe array 300 is exposed.

Figure 24:
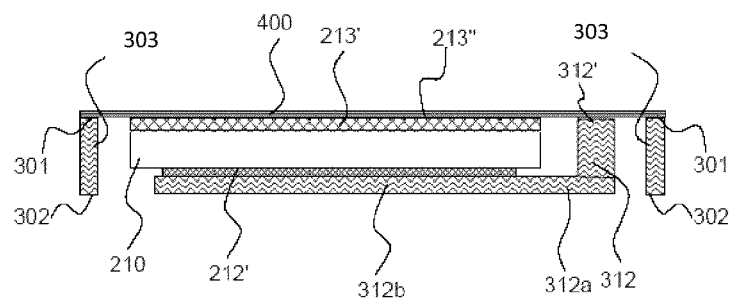

As shown in FIG. 24, in the sectional structure of the leadframe unit 310 mounted with chip 210, the tape 400 contacts and covers the bottom 312' of the source terminal 312, the bottom 213" of the backside metal layer 213' and the first surface 301 of the leadframe 300.

Figure 25:
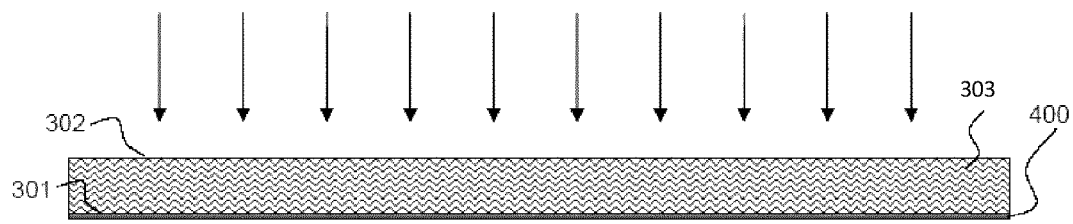
Figure 26:
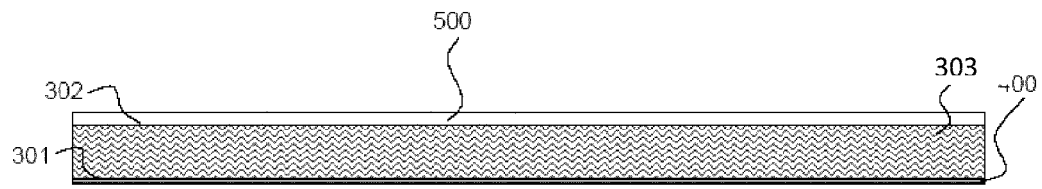

As shown in cross sectional view FIG. 25, a molding process is carry out in a cavity of a mold chase by injecting a molding material generally referred to as epoxy molding compound. After the molding process in finished, as shown in cross sectional view FIG. 26, the backside 302 of the leadframe 300 and the gaps between the frame 303 and the chip 210, the second metal contact finger 312b, the first metal contact finger 311b, the extending structure of the gate terminal 311a, the gate terminal 311, the extending structure of the source terminal 312a, the source terminal 312, the tie bar 312c and the tie bar 312c are all encapsulated with the molding compound 500, while the bottom 312' of the source terminal 312, the bottom 311' of the gate terminal 311 and the bottom 213" of the backside metal layer 213' are protected by the tape 400 from being contaminate by the molding compound.

Figure 27:
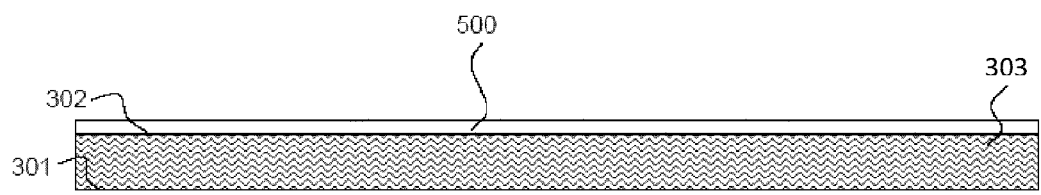
Figure 28:
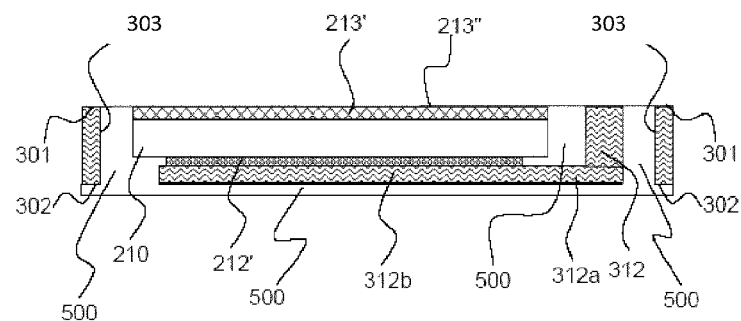
Figure 29:
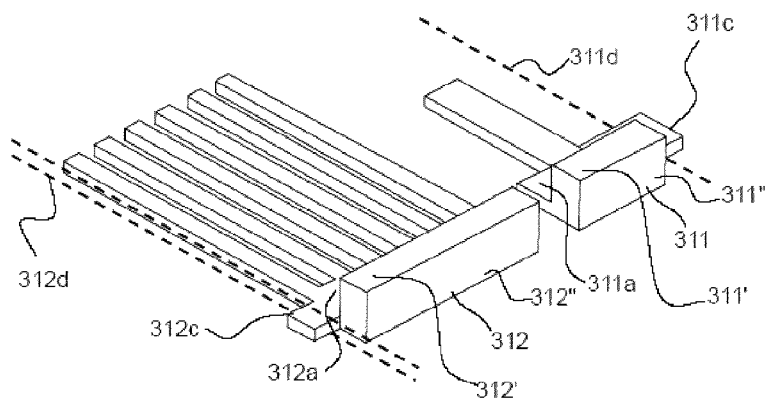

As shown in cross sectional view FIG. 27, the tape 400 is then removed from the first surface 301 of the leadframe 300. as shown in cross sectional view FIG. 28, the space around the chip 210 is filled with the molding compound 500 while the chip 210, the second metal contact finger 312b, the first metal contact finger 311b, the extending structure of the gate terminal 311a, the gate terminal 311, the extending structure of the source terminal 312a, the source terminal 312, the tie bar 312c, the tie bar 312c and other components are all encapsulated by the molding compound 500. However, due to the removal of the tape 400, the bottom 312' of the source terminal 312, the bottom 311' of the gate terminal 311, the bottom 213" of the backside metal layer 213' and the first surface 301 of the leadframe 300 are all exposed.

After the molding is finished, the package block of molded leadframe is sawed to separate the package units. As shown in perspective view FIG. 29, the sawing line 312d and 311d are the sawing locations specified, and the tie bars 312c and 312c are cut off in the sawing process. The gate terminal 311 and source terminal 312 are also separated from the leadframe 303 if they are previously connected through additional tie bars or even fused together. The chip 210, the second metal contact fingers 312b, the first metal contact finger 311b, the extending structure of the gate terminal 311a, the gate terminal 311, the extending structure of the source terminal 312a, the source terminal 312 and the encapsulating molding compound of each package unit are all separated from the leadframe 300 by sawing, thus getting the semiconductor device 600, as shown in FIG. 30.

Figure 30:
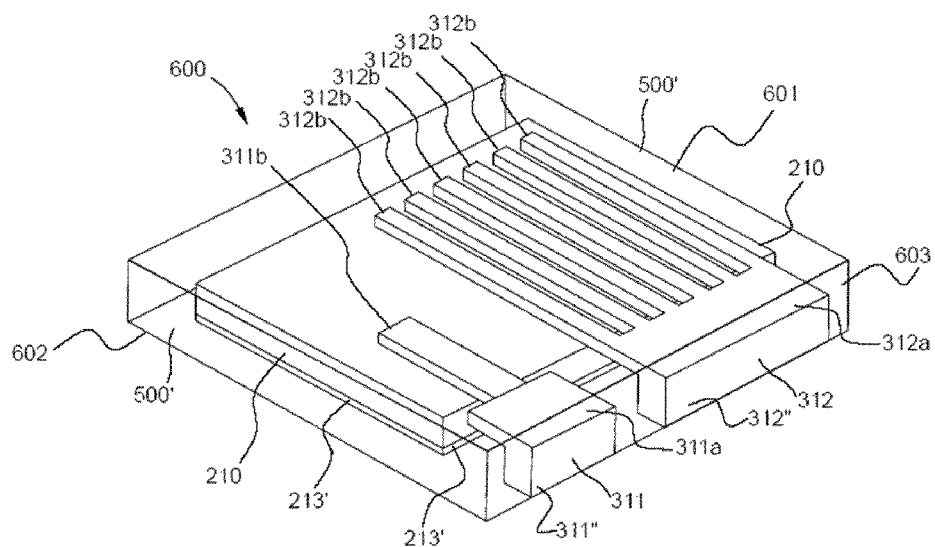
Figure 31:
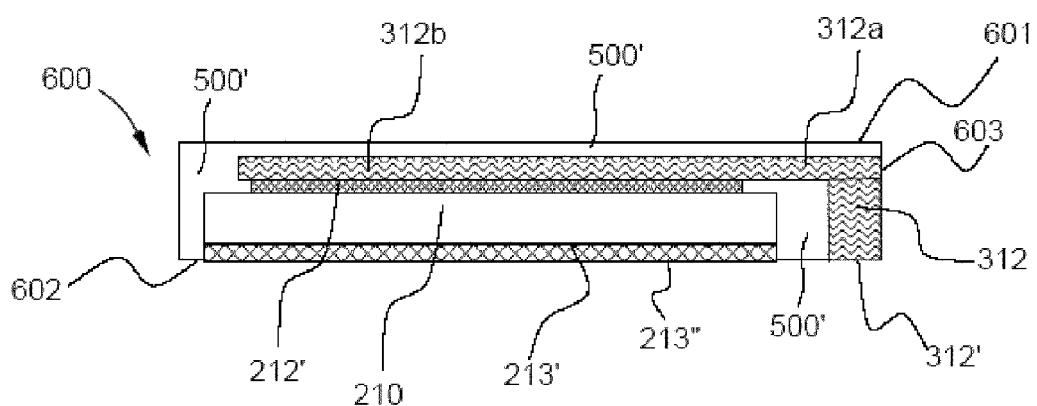

Referring to FIGS. 30 and 31, the perspective structure of the semiconductor device 600 is shown in FIG. 30 while the cross sectional structure of the semiconductor device 600 is shown in FIG. 31, wherein the package molding material 500' is obtained by sawing the molding compound 500. In combination with the figures from FIG. 8 to FIG. 31, the semiconductor device 600 comprises the gate terminal 311 connecting to the extending structure 311a of the gate terminal, wherein the extending structure 311a of the gate terminal 311 is provided with the first metal contact finger 311b extending over and contacting to the second gate metal layer 211 on the chip 210, wherein the second gate metal layer 211 is connected with the first metal contact finger 311b via the conductive material 211' applied on the second gate metal layer 211; the semiconductor device 600 further comprises the source terminal 312 connecting to the extending structure 312a of the source terminal, wherein the extending structure 312a of the source terminal 312 is provided with a plurality of the second metal contact fingers 312b extending over and contacting to the second source metal layer 212 of the chip 210, wherein the second source metal layer 212 is connected with a plurality of the second metal contact fingers 312b via the conductive material 212' applied on the second source metal layer 212. The bottom 311' of the source terminal 312, the bottom 311' of the gate terminal 311 and the bottom 213" of the backside metal layer 213' in FIG. 19 are all exposed on the bottom 602 of the semiconductor device 600 in FIG. 30 and FIG. 31. In FIGS. 30 and 31, the top face 601 of the semiconductor device 600 is opposite to the bottom 602 while a side wall 603 of the semiconductor device 600 is adjacent to the top face 601 and bottom 602.

As shown in FIG. 30, the package 500' is obtained by sawing the molding compound 500 and the leadframe 300 therefore a side surface 312" of the source terminal 312 and a side surface 311" of the gate terminal 311 are exposed on the side wall 603 of the semiconductor device 600.

In the semiconductor device 600, the bottom 311' of the gate terminal 311 exposed is used to form the outer gate contact terminal of the chip 210; the bottom 312' of the source terminal 312 exposed is used to form the outer source contact terminal of the chip 210; the bottom 213" of the backside metal layer 213' exposed is used to form the outer drain contact terminal of the chip 210. In one embodiment the bottom 213" of the backside metal layer 213', the bottom 311' of the gate terminal 311 and the bottom 312' of the source terminal 312 are substantially coplanar. In another embodiment, the side 312" of the source terminal 312 and the side 311" of the gate terminal 311 exposed on the side wall 603 of the semiconductor device 600 are substantially perpendicular to the bottom 213" of the backside metal layer 213', the bottom 311' of the gate terminal 311 and the bottom 312' of the source terminal 312. In another embodiment, the side 312" of the source terminal 312 and the side 311" of the gate terminal 311 exposed on the sidewall 603 of the semiconductor device 600 are coplanar to the semiconductor device sidewall 603. The semiconductor device 600 has no external leads extending beyond the package body, therefore the additional space for accommodating the external leads in prior art package can be translated inside the package body to accommodate a larger size semiconductor chip for delivering more power while maintain the same footprint.

The description and the figures show the typical embodiments of the specific structures in detail. Although the present invention sets forth these preferred embodiments, these contents shall not be considered as restrictive to the invention. Many variations and modifications may be made thereto without departing from the spirit and scope of the invention. Therefore, the scope of the invention should be determined with respect to the appended claims, including the full scope of equivalents thereof.

What is claimed is:

1. A method of making a chip-exposed semiconductor package comprising:
    plating a metal on a front side of a wafer comprising a plurality of chips thereon, wherein each chip on the wafer is provided with a gate electrode comprising a first gate metal layer and a source electrode comprising a first source metal layer on the front face of the wafer wherein the step of forming a plurality of plating areas on a front face of each chip comprising plating a second gate metal layer on top of the first gate metal layer and a second source metal layer on top of the first source metal layer, said plating a metal therefore forms a plurality of plating areas on a front face of each chip;
    grinding a backside of the wafer to reduce a thickness of the wafer;
    depositing a back metal layer on the backside of the wafer after grinding;
    applying a layer of conductive adhesive material on said plurality of plating areas;
    sawing the wafer with the back metal layer to form a plurality of separate chips each having the back metal layer located on a backside of the chip;
    providing a leadframe comprising a plurality of paddles, wherein each of the paddles is provided with a first metal contact finger and a plurality of second metal contact fingers substantially coplanar with the first metal contact finger and wherein a face of said first metal contact finger interfaces with the second gate metal layer via the conductive adhesive material and a face of said second metal contact fingers interfaces with the second source metal layer via the conductive adhesive material, and
    mounting a chip with the front face of the chip adhering onto a front face of each of the plurality of paddle through the conductive adhesive material disposed on the front face of the chip;
    adhering a tape on the back metal located on the backside of the chip;
    encapsulating the leadframe and the plurality of chips adhered onto the leadframe with a molding compound;
    removing the tape to expose the back metal on the backside of the chip through the molding material;
    sawing through the leadframe and the molding compound to form a plurality of packaged semiconductor devices.

2. The method of claim 1 wherein each chip is further provided with a drain electrode comprising the back metal layer.

3. The method of claim 1 wherein the step of mounting the chip to the paddle further comprises flip-chip mounting the chip onto the paddle with the second gate metal layer connected to the first metal contact finger and the second source metal layer connected to the plurality of the second metal contact fingers.

4. The method of claim 3 wherein the first metal contact finger is connected via an extending structure to a gate terminal extending away from a plane substantially coplanar to the first metal contact finger; and
    the plurality of the second metal contact fingers are connected via an extending structure to a source terminal extending away from a plane substantially coplanar to the second metal fingers.

5. The method of claim 4 wherein a bottom of the gate terminal and the source terminal is coplanar to a bottom of the back metal layer after flip mounting the chip.

6. The method of claim 5, wherein the step of adhering a tape on the back metal located on the backside of the chip further comprising adhering the tape to cover the bottom of the gate terminal and the source terminal and the bottom of the back metal layer.

7. The method of claim 6 wherein the bottoms of the back metal layer, the gate terminal and the source terminal are exposed through the molding compound.

8. The method of claim 4 wherein the molding compound covers the gate terminal and its extending structure, the first metal contact finger, the source terminal and its extending structure, the second metal contact finger, as well as the chip.

9. The method of claim 8 wherein a side face of the gate terminal and a side face of the source terminal on a sidewall of the package are exposed after sawing through the leadframe and the molding compound.

10. A method of making a chip-exposed semiconductor package comprising:

providing a leadframe array comprising a plurality of leadframe units wherein each of the leadframe unit comprising a paddle portion and a terminal portion, the paddle portion comprising a first metal contact finger and a plurality of second metal contact fingers substantially coplanar with the first contact finger therefore providing a paddle surface for a chip mounting thereon, the terminal portion comprising a gate terminal connecting to the first contact finger and a source terminal connecting to the plurality of second contact fingers, wherein both the gate terminal and the source terminal extend vertically from the paddle surface to and terminating at a terminal surface substantially parallel to the paddle surface thus providing a bottom face of the gate terminal and a bottom face of the source terminal substantially coplanar to the terminal surface;

flip-chip mounting a semiconductor chip on the paddle portion of each of the plurality of the leadframe unit, wherein each chip having a gate electrode and a source electrode disposed on a front face and a drain electrode disposed on a back face opposite to the front face, the gate electrode electrically connecting to the first contact finger and the source electrode electrically connecting to the plurality of the second contact fingers, wherein the drain electrode comprising a back metal layer substantially coplanar to the terminal surface;

adhering a tape onto the back metal of the chip and the bottoms of the gate terminal and source terminal;

encapsulating the plurality of leadframe units and the plurality of chips adhered onto the leadframe with a molding compound;

removing the tape to expose the back metal on the backside of the chip and the bottoms of the gate and source terminals through the molding material;

sawing through the leadframe and the molding compound to form a plurality of packaged semiconductor devices, a side face of the gate terminal and a side face of the source terminal vertically extending from the paddle surface to the terminal surface exposed on a sidewall of the packaged semiconductor device.

11. The method of claim 9 wherein the gate electrode of the semiconductor chip connecting to the first contact finger through a second gate metal layer plated on top of the gate electrode and source electrode of the semiconductor chip connecting to the plurality of second contact fingers through a second source metal layer plated on top of the source electrode.

* * * * *